(12) United States Patent
Lee et al.

(10) Patent No.: US 6,269,325 B1
(45) Date of Patent: Jul. 31, 2001

(54) VISUAL PRESENTATION TECHNIQUE FOR DATA MINING SOFTWARE

(75) Inventors: Yuchun Lee, Charlestown; Ruby Kennedy, Lincoln, both of MA (US)

(73) Assignee: Unica Technologies, Inc., Lincoln, MA (US)

( * ) Notice: Subject to any disclaimer, the term of this patent is extended or adjusted under 35 U.S.C. 154(b) by 0 days.

(21) Appl. No.: 09/176,370

(22) Filed: Oct. 21, 1998

(51) Int. Cl.[7] ...................................................... G06F 17/50
(52) U.S. Cl. ................... 703/2; 703/22; 706/21; 707/3; 345/440
(58) Field of Search .................... 703/22, 2, 27; 706/22, 919, 21, 20; 345/433, 342, 346, 440; 707/2, 3

(56) References Cited

U.S. PATENT DOCUMENTS

| | | | |
|---|---|---|---|
| 5,692,107 | * 11/1997 | Simoudis et al. | 395/50 |
| 5,754,738 | * 5/1998 | Saucedo et al. | 395/12 |
| 5,809,499 | * 9/1998 | Wong et al. | 707/6 |
| 5,861,891 | * 1/1999 | Becker | 345/433 |
| 5,930,803 | * 7/1999 | Becker et al. | 707/104 |
| 5,966,139 | * 10/1999 | Anupam et al. | 345/440 |
| 5,999,192 | * 12/1999 | Selfridge et al. | 345/440 |
| 6,044,366 | * 3/2000 | Graffe et al. | 707/2 |

OTHER PUBLICATIONS

Keim et al., "Supporting Data Mining of Large Databases by Visual Feedback Queries," IEEE, 1994, pp. 302–313.*
Keim et al., "Visualization Techniques for Mining Large Databases: A Comparison," IEEE, 1996, pp. 923–938.*
Lee et al., "Visualization Support for Data Mining," IEEE, 1996, pp. 69–75.*
Mohamed Hababa, "Intelligent Hybrid System for data mining", IEEE, pp. 111.*

* cited by examiner

Primary Examiner—Kevin J. Teska
Assistant Examiner—Thai Phan
(74) Attorney, Agent, or Firm—Fish & Richardson, P.C.

(57) ABSTRACT

A method for presenting measurements of modeling performance for a plurality of modeling algorithms is described. The method displays a lift chart on an output display device. The lift chart has at least three lift curves, each of said three lift curves corresponding to a result obtained from executing one of the plurality of modeling executions with each lift curve being rendered on the output device using a different, visual indicia.

6 Claims, 9 Drawing Sheets

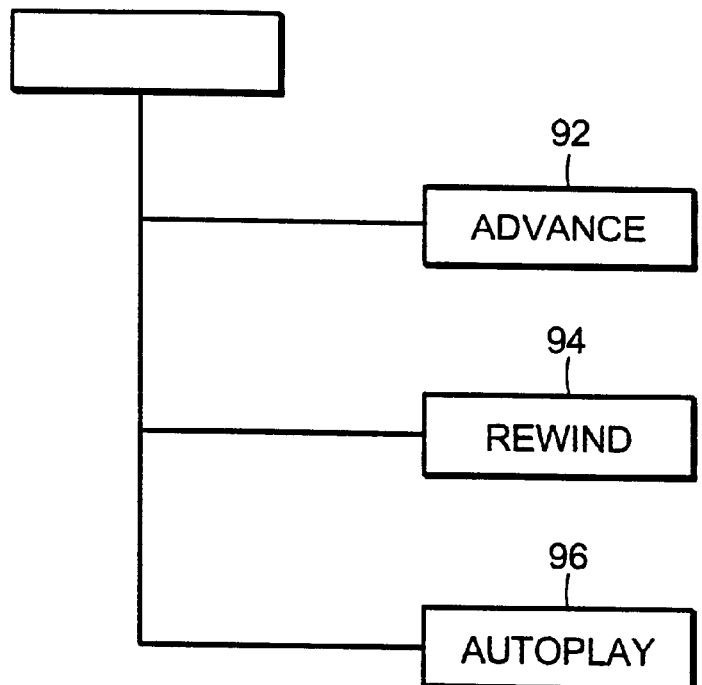
FIG. 6B
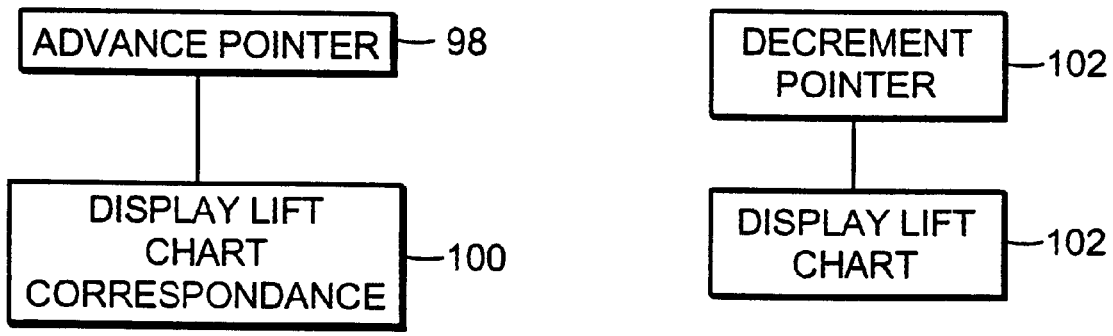
FIG. 6C
FIG. 6D

VISUAL PRESENTATION TECHNIQUE FOR DATA MINING SOFTWARE

BACKGROUND

This invention relates generally to data mining software.

Data mining software extracts knowledge that may be suggested by a set of data for various uses. For example, data mining software can be used to maximize a return on investment made in collecting marketing data as well as other applications such as credit risk management, process control, medical diagnosis and so forth. Typically, data mining software uses one or a plurality of different types of modeling algorithms in concert with a set of test data to determine what types of characteristics are most useful in achieving a desired response rate or behavioral response from a targeted group of individuals represented by the data. Generally, data mining software executes complex data modeling algorithms such as linear regression, logistic regression, back propagation neural network, Classification and Regression (CART) and Chi squared Automatic Interaction Detection (CHAID) decision trees, as well as, other types of algorithms on a set of data. The results obtained by executing these algorithms are typically conveyed to a decision maker in order to decide what type of model might be best for a particular use.

One technique which is used to convey this information to a decision maker is the use of a visual representation of model performance such as a lift chart or a receiver operating characteristic curve. A lift chart measures the ability of a model to rank order scores so that higher scores exhibit more of the model's attribute or behavior. Whereas, a receiver operating characteristic curve compares a percentage of hits to a percentage of false alarms produced by a model of behavior thereby providing a measure of the accuracy of a model.

In response modeling a lift chart can be used to visually describe which prospects are more likely to respond to a particular stimuli. For example, a lift chart can be used in a marketing promotion campaign to identify likely responders versus non-responders. Therefore in such an application, the X axis of a lift chart would represent file depth, or the fraction of all prospects that can be contacted, whereas the Y axis of would show a fraction of all responders that would be successfully targeted at a specified file depth.

A lift chart is typically referenced from a base line which is a line of the form y=x which indicates the average or expected performance of not using a model. That is, for example, when 30% of all prospects are contacted, 30% of all responders are expected to be reached. When 40% are contacted, 40% of responders are expected to be reached and so forth. An algorithm that sorts prospects by their propensity to perform in an expected behavioral manner will produce a result that can be plotted as a lift curve. A useful model will produce a lift curve that is above (i.e., exhibits lift) the diagonal reference line.

The lift over the diagonal reference line is the expected or predicted improvement generated by the model by intelligently targeting specific prospects based on model inputs. The model inputs will vary based upon the application to which the data mining software is being applied, as well as the nature of the algorithm type used in the model.

While the conventional lift chart is adequate to provide a visual depiction of predicted modeling behavior, the conventional lift chart may become inadequate when the data mining software executes a large plurality or type of algorithms or a large number of algorithms of the same type.

SUMMARY

According to an aspect of the present invention, a method for presenting measurements of modeling performance for a plurality of modeling algorithms includes displaying on an output display device a lift chart, the lift chart, having at least three lift curves, each of said three lift curves corresponding to a result obtained from executing one of the plurality of modeling executions with each lift curve being rendered on the output device using a different, visual indicia.

According to an additional aspect of the invention, a computer program product residing on a computer readable medium for displaying results of modeling of expected behavior from execution of a plurality of modeling algorithms that model the expected behavior, includes instructions for causing a computer to run the plurality of models on a set of test data to produce results of the expected behavior from the model and to produce data that can be converted into a measure of the expected behavior. The computer program also causes the computer to produce a visual representation of the results of modeling the expected behavior and render the results of modeling the expected behavior on an output device using different visual indicia to represent the different results of modeling the expected behavior.

One or more of the following advantages are provided by the aspects of the invention. Lift curves for different algorithms or algorithm types are color-coded or provided with other visual indications for easy identification to distinguish each curve. The user can change which algorithms are displayed in the chart and which colors or other visual indications are assigned to each algorithm. Also lift curves from a specific algorithm and lift curves representing different models can be superimposed in a single lift chart with the best performing model being highlighted in a specific color. Each of the other model instances can be displayed in a different color or provided with other visual indications. In addition, the invention allows the user to view the performance of a particular algorithm while varying other factors to understand how variance of other factors affects the performance of the algorithm. The invention permits a user to view the evolution of lift charts over time to determine if additional processing is necessary.

BRIEF DESCRIPTION OF THE DRAWINGS

FIGS. 6A–6D are flow charts for a process that shows a visualization of lift charts over time.

DETAILED DESCRIPTION

Figure 1:
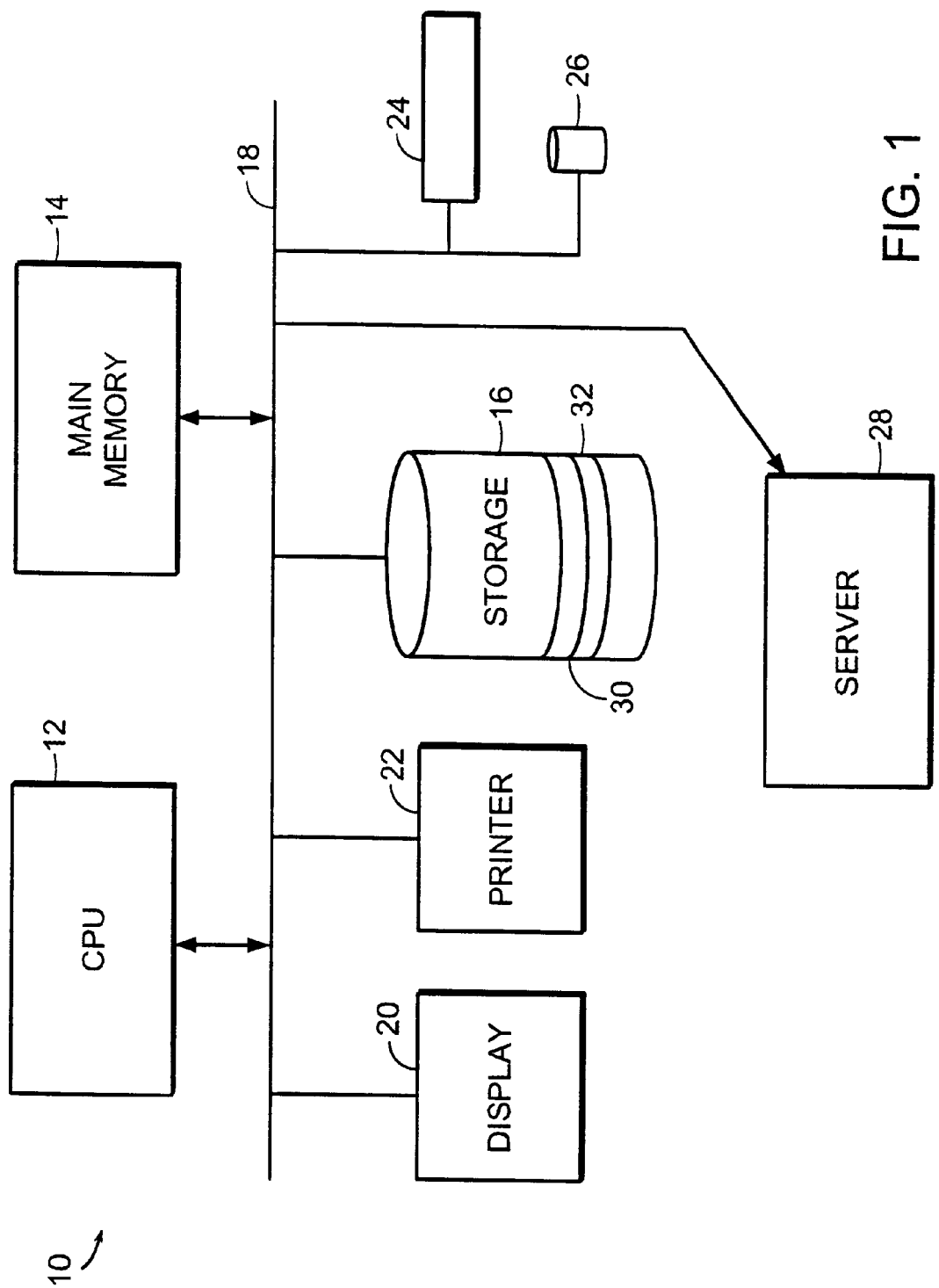
FIG. 1 is a block diagram of a computer system executing data mining software including visual representation software.

Referring now to FIG. 1, a computer system 10 includes a CPU 12, main memory 14 and a persistent storage device 16 all coupled via a computer bus 18. The system also includes output devices such as a display 20 and a printer 22 and user input devices such as a keyboard 24 and mouse 26. Not shown in FIG. 1 but which would necessarily be included in FIG. 1 are software drivers and interfaces to couple all the afore-mentioned elements to the processor 12.

The computer system 10 also includes visualization rendering software 32 which may be part of data mining software 30. The data mining software 30 may reside on the computer system 10 or may reside on a server 28, as shown, which is coupled to the computer system 10 in a conventional client-server manner. The details how the data mining software is coupled in the system 10 are not important in understanding the present invention.

The data mining software 30 is of the type in which several or many different algorithm types, such as, linear regression, logistic regression, a back propagation neural network, Classification and Regression (CART) and Chi squared Automatic Interaction Detection (CHAID) decision trees, Naive Bayesian, genetic searching for varible selection and parameter tuning, as well as other types of algorithms, operate on a set of data. Alternatively, the data mining software can use any one of these types of algorithms with different modeling parameters that produce different results. When the algorithm returns results, the display 20 or printer 22 provides a decision maker with a visual rendering of these results, whether the results are based on different algorithm types or different sets of parameters used in the same algorithm.

Figure 2:
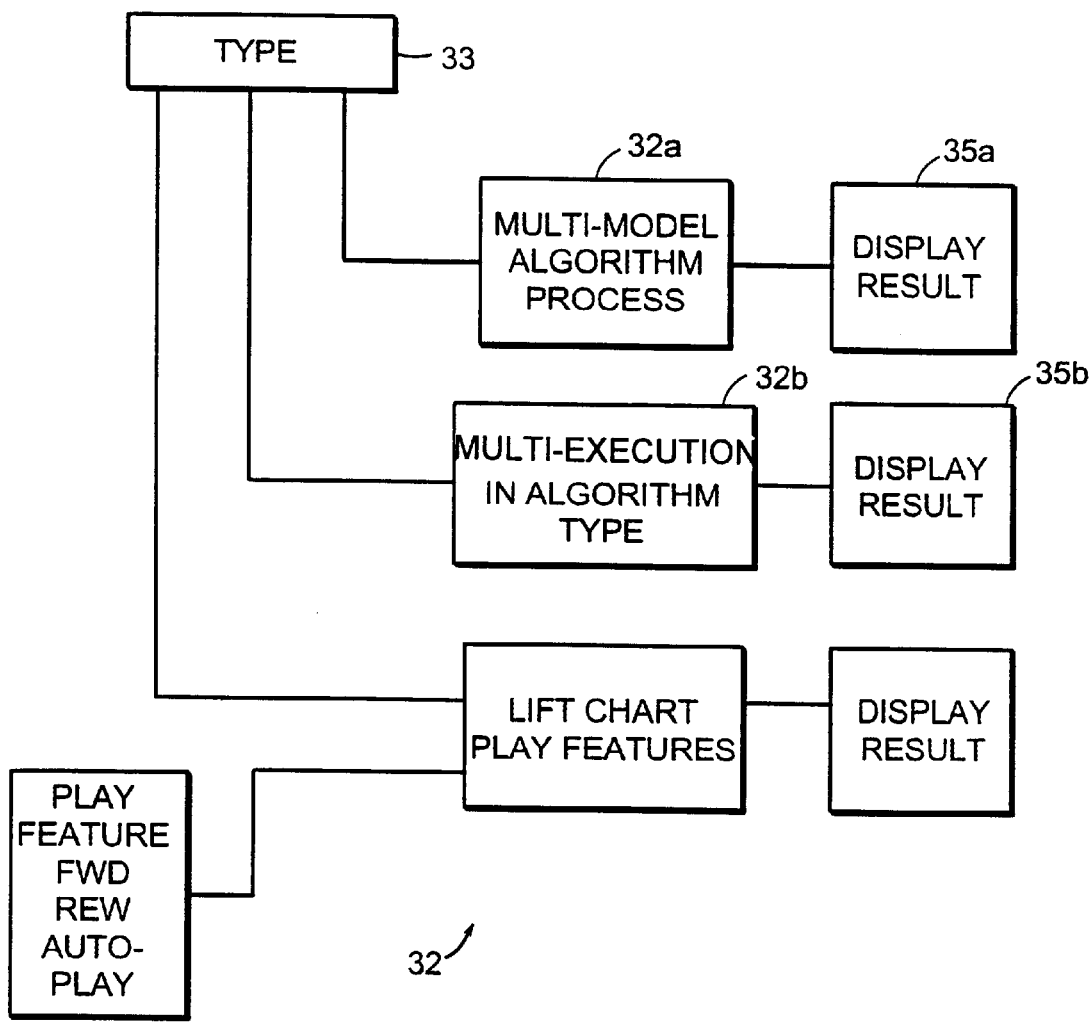
FIG. 2 is a flow chart of the visual representation software for the data mining software of FIG. 1.

Referring now to FIG. 2, a visualization rendering software 32 can handle multiple here three result types. It selects 33 one of the three processes to render results for a user depending on the result type.

Figure 3A:
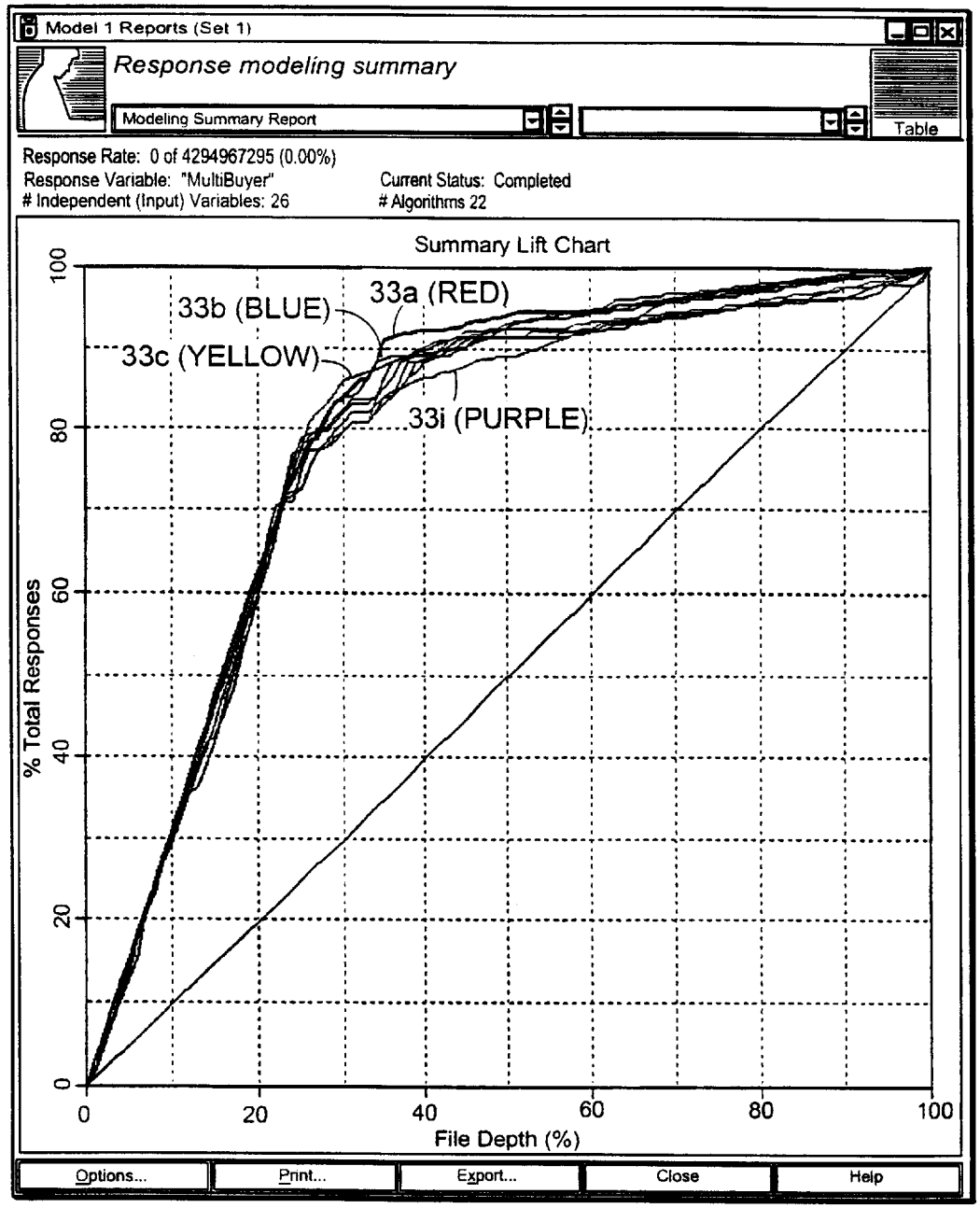
FIGS. 3A–3C are diagrams of lift charts for the A processes shown in FIGS. 4–6D.

The first result type 32a is for comparison of multiple modeling algorithms. In multiple modeling algorithms 32a, a lift chart (FIG. 3A) is rendered or displayed 35a having multiple lift curves 33a–33i produced from running multiple model types or algorithms. One approach is that the best lift curve from each model of each algorithm type is displayed by superimposing the lift curves 33a–33i on a single lift chart. The lift curve for the best model e.g., 33a is highlighted in a specific color (e.g., red) and optionally with a thicker line or different line type. The lift curves 33b, 33c, 33i for other algorithm types are color-coded or provided with other visual indications e.g., blue, yellow and purple respectively, for easy identification to distinguish each curve. The user can change which algorithms are displayed in the lift chart and which colors or other visual indications are assigned to each algorithm. For example, a red default color can be used to always represent the best performing model.

Figure 3B:
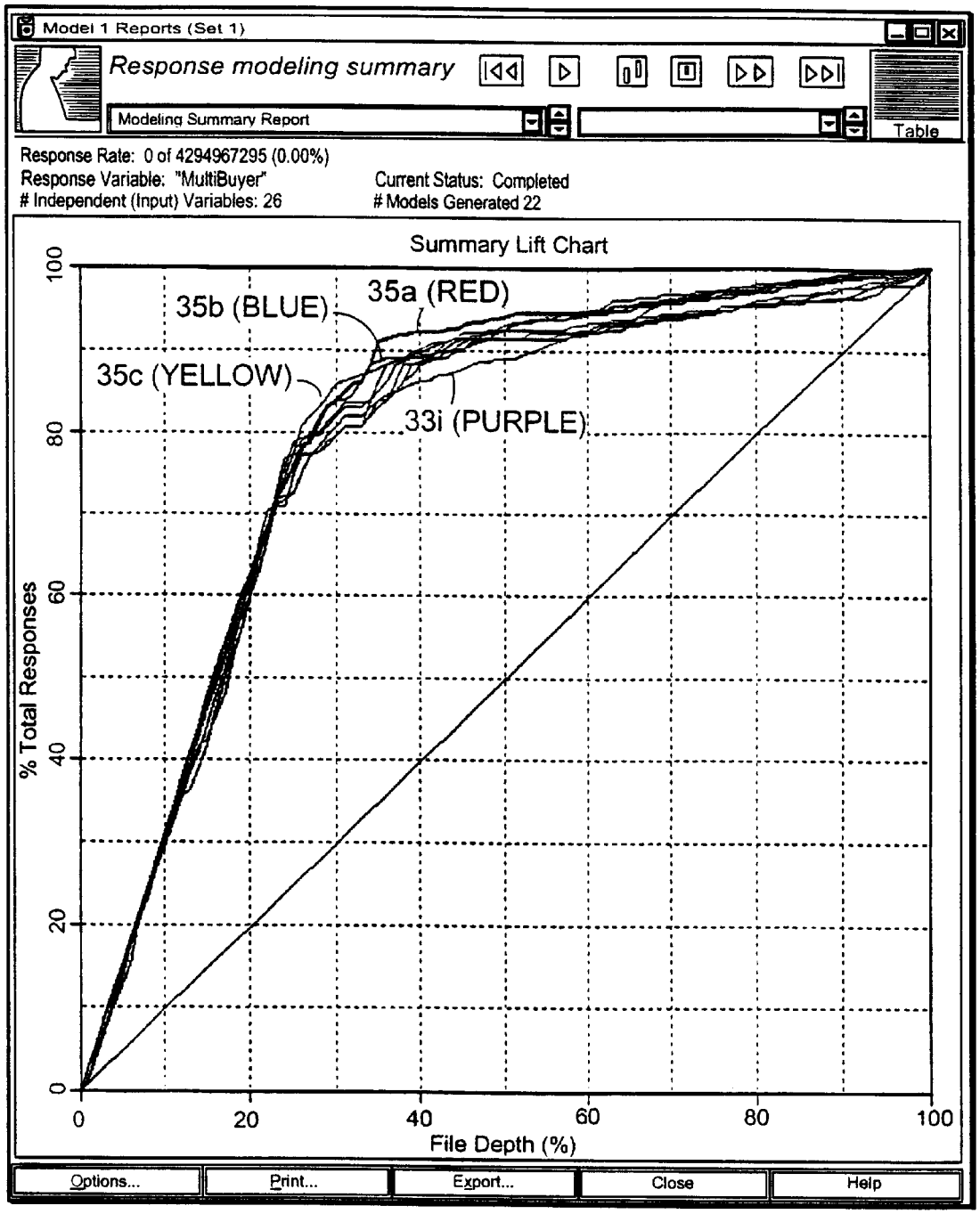

A second result type 32b is to compare within a single modeling algorithm all of the individual model instances or executions of that type. In this version, lift curves 35a–35i from a specific algorithm are displayed and the lift curves 35a–35i representing different models are superimposed in a single lift chart (FIG. 3B) with the lift curve for the best performing model, that is, the algorithm that was executed using the best parameters being highlighted in a specific color, again, for example, red and optionally with a thicker line or different line type. Each of the other lift curves 35b, 35c and 35i for the other model instances can be displayed in a different color e.g., respectively, blue, yellow and purple or be provided with other visual indications and the user can specify the number of model instances to display. Similarly, the user can also change the defaults for those particular displays.

Figure 3C:
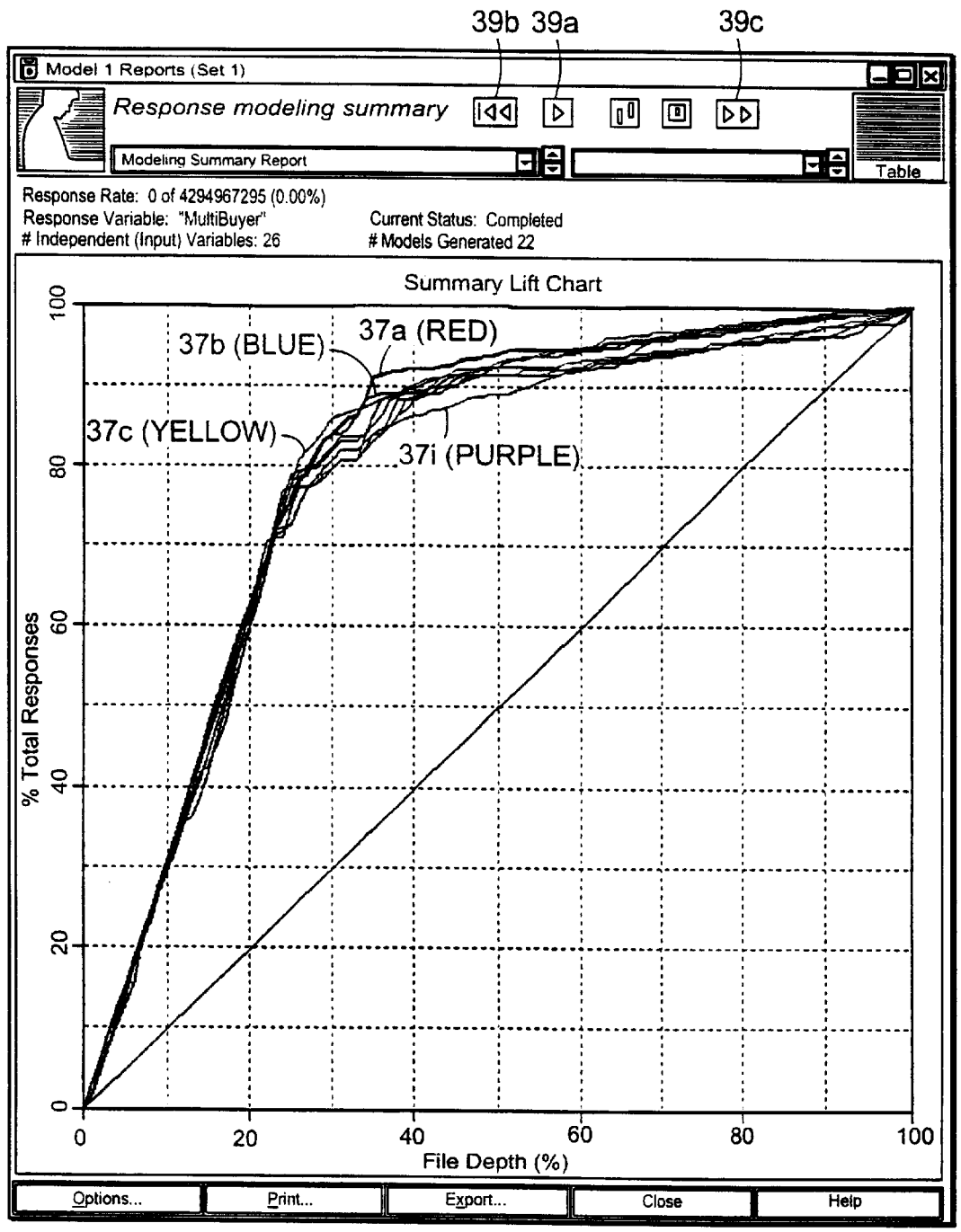

A third result 32c produces a lift chart (FIG. 3C) that shows an evolution of the data over time. In this version of the lift chart, a user can play and watch a display render lift curves as they are generated by a series of models executing over time. The controls can include a forward 39c, backward 39a as well as, fast forward, fast rewind, go to specific time, control of time increment and step by step model features (all not shown) and auto play 39a features. The user, in addition, can control the number of lift curves for the top models to display and as with the models set forth above, the lift curve 37a for the best model can be highlighted in a specific color and lift curves 37b, 37c and 37i for remaining models can be highlighted in different colors.

These curves are displayed on the various types of lift charts, and represent results that are produced by executing a specific model given specific parameters or characteristics and specific test data. The computer mouse 26 can position a cursor on the display, for example, over the curve such that a box can be produced that displays the algorithm type, number or percentage of responders at that point and the number of people contacted or a fraction or percentage of the file that was contacted.

The visualization and comparison processes 32a–32c for multiple models allows a user to view the best performing models of each model type that were run to determine which algorithm works best on a particular set of data taking in consideration the specific problem at hand. In addition, the visualization technique 32 allows the user to view the performance of a particular algorithm while varying other factors to understand how variance of other factors affects the performance of the algorithm. The visualization technique will permit a user to view the evolution of lift charts over time to determine if additional processing is necessary.

Figure 4:
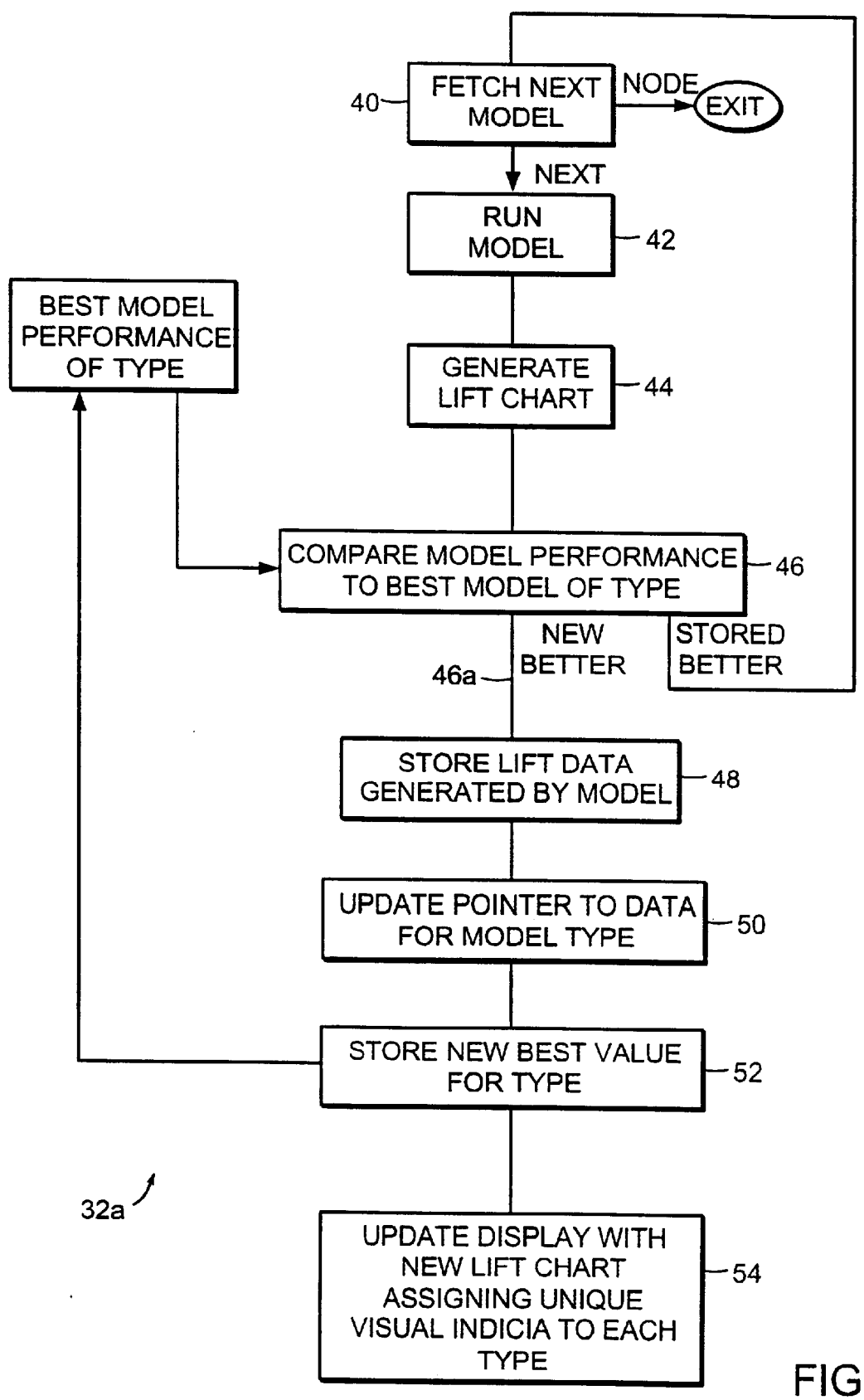
FIG. 4 is a flow chart of a process to produce a lift chart for a plurality of different modeling algorithms.

Referring now to FIG. 4, visualization software 32a that renders unique visual indications for different modeling algorithms is shown. The visualization software 32a has the data mining software fetch a model 40 and execute the model 42. When the fetched model is executed, the visualization software 32a will generate 44 lift chart data corresponding to results obtained from executing the model. These results can be represented in any number of ways. For example, the results can be represented in a gains table, lift chart, or response per segment graph.

The model performance can be measured in many ways. One measure is to determine an area under a lift curve. Other measures include determining a lift value at a specified file depth, a minimized RMS (root mean square) error, or a maximized profit criterion. Other measures are also possible. The model performance provided from executing a particular model is compared 46 to the performance of the best model of that type up to that point. If the new model performance is better 46a, the lift data associated with that model is stored 48 and a pointer to the lift data is updated 50 for the model type. The visualization software 32a also stores 52 the new best value (i.e., performance measure) for that model type. This is used for a subsequent iteration of the visualization software 32a. The visualization software 32a also can update 54 an output rendering device such as a display with a new lift chart assigning a new visual indicia to each curve displayed in the chart, as shown in FIG. 2A. The visual indicia can have a default color assigned to the new best one such as red as mentioned above and will have other, different colors assigned to the remaining ones. Other visual indicia can also be used such He as changing line widths or styles. In addition, curves, can be drawn or rendered with different marker types such as, squares, circles, triangles, diamonds, and so forth. The visualization software can manage the number of curves that are displayed at any one time by changing a pointer to drop the lowest one of a maximum number of curves that have been rendered.

Figure 5:
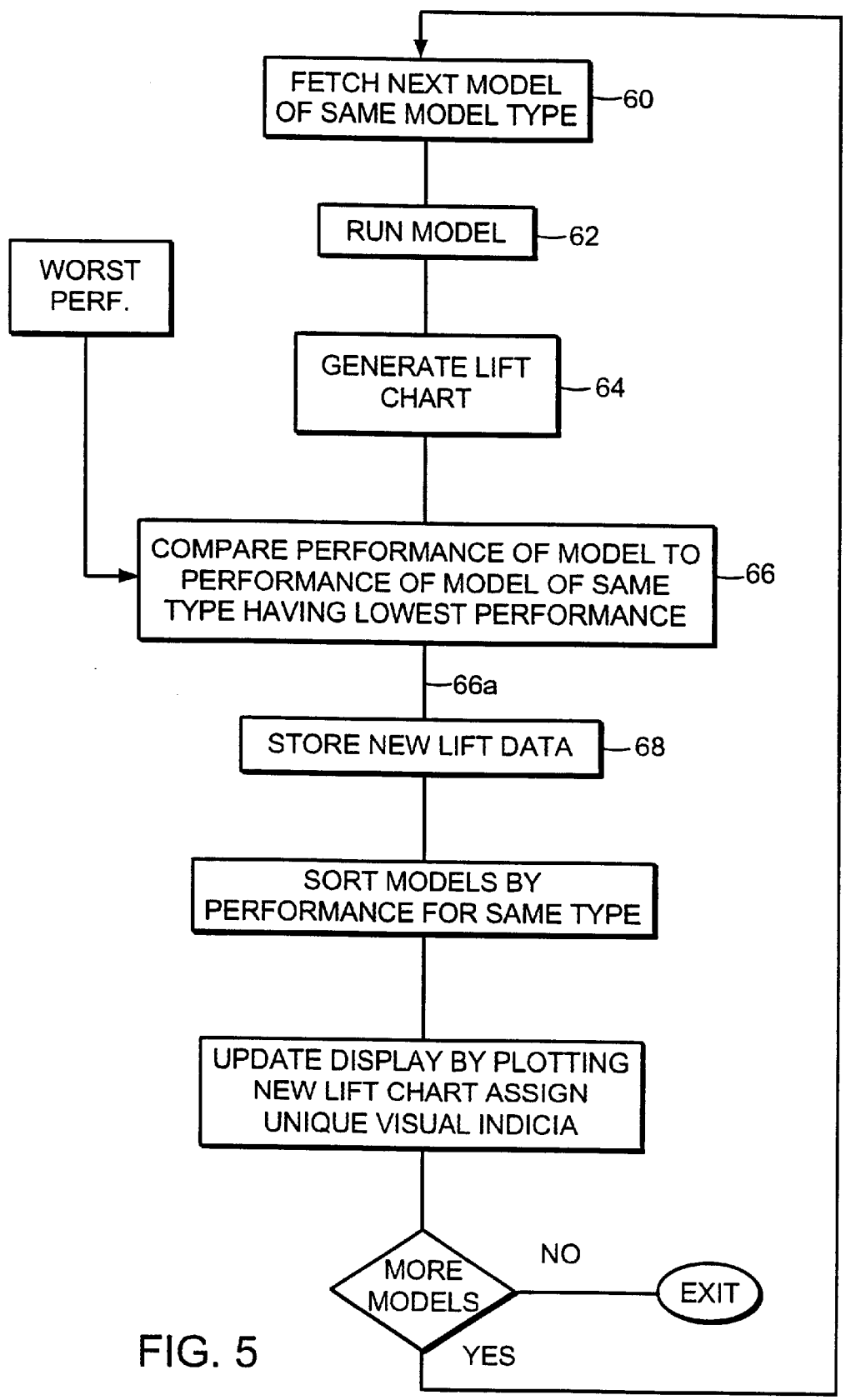
FIG. 5 is a flow chart of a process for producing a lift chart for a plurality of models of the same algorithm type.

Referring now to FIG. 5, visual rendering software 32b to render a representation of model performance provided by executing a particular modeling algorithm is shown. The visual rendering software 32b has the data mining software fetch 60 a new set of parameters for an execution of a particular model type. The data mining software 30 will run or execute the model 62 with the new parameters. The visualization software 32b will generates 64 lift chart data corresponding to results obtained from executing the model with the new parameters. These results can be displayed in any number of ways as described above.

The model performance that is provided from executing the model, as described above, with the particular parameters is compared 66 to the performance from the worst set of parameters of that model type up to that point. If the new model performance is worse 66a, the lift data associated with that model is stored 68 and a pointer to the lift data is updated for the model type to sort 70 models by performance for same type. The visualization software 32b also stores a new worst value for that model type for subsequent iterations of the software 32b and updates 54 an output rendering device, such as display 20, with a new lift chart assigning a new individual indicia to each curve displayed in the chart, as shown in FIG. 2B. The visualization software 32b can manage the number of curves that are displayed at any one time. Thus, while comparing performance, the software can also determine if a maximum number of curves have been stored. In that case the software 32b would adjust pointers to drop the current worst performance result and store the next worst performance result.

Figure 6A:
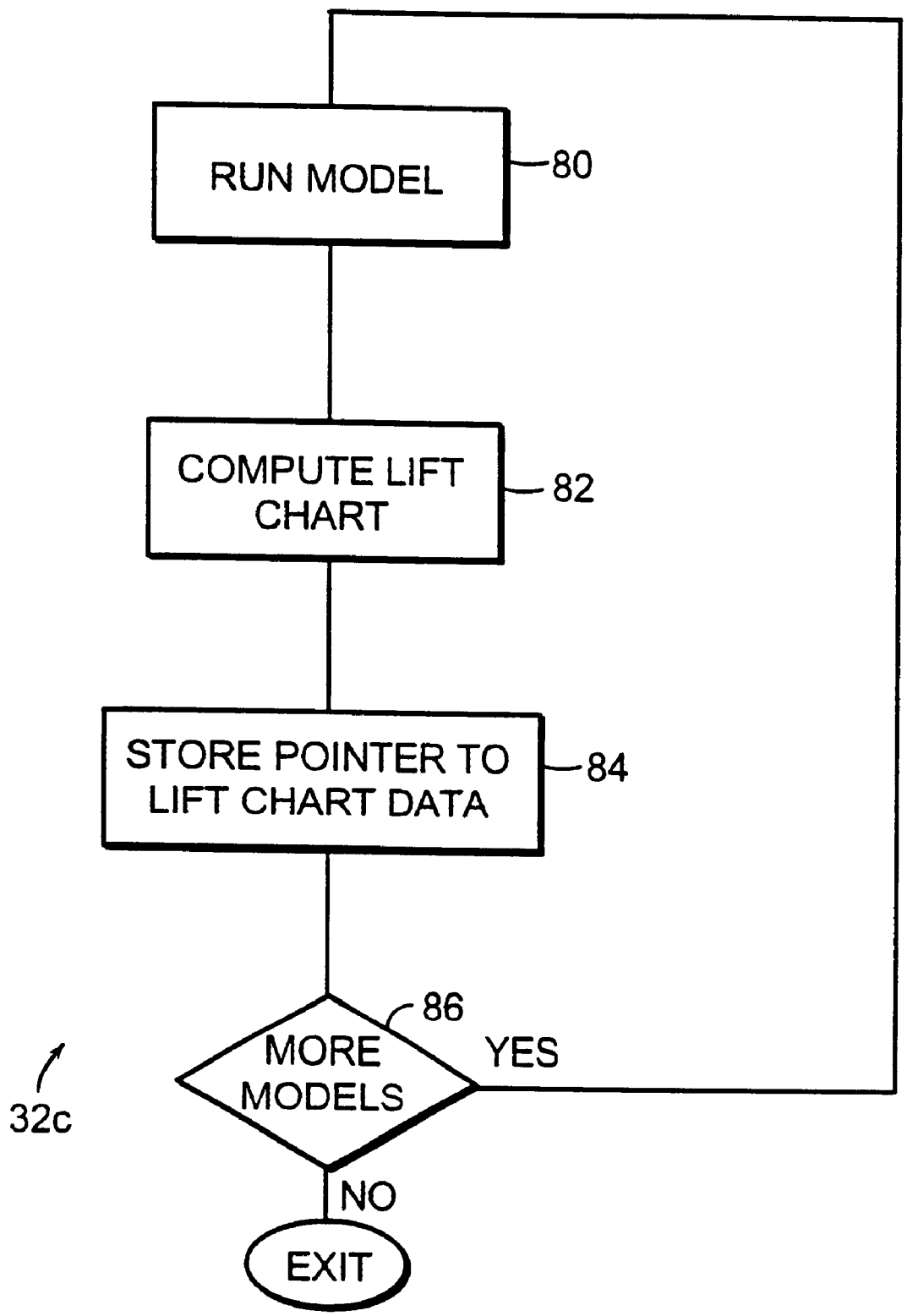

Referring now to FIG. 6A, the visual rendering software 32c executes a model 80 and computes 82 lift chart data from the results of executing the model. The visualization software 32c stores a pointer 84 to the lift chart data. The visualization software 32c tests if there are more models 86 and, if there are more models, continues the aforementioned process. Otherwise, the software exits.

Referring now to FIG. 6B, during a user interaction with the visualization software representation of the executed models as set out in FIG. 6A, a user can manipulate the lift chart in order to determine how the lift charts change over time. Thus, for example, the user can watch the generation of lift curves by a series of models built over time and control how the models are presented to the user. For example, the user can use advance 92, rewind 94, auto play 96, as well as, fast forward, fast rewind, go to specific time, and control of time increment, features to control generation of the lift chart. Three of such features are shown in FIG. 6B, advance, rewind and auto play.

Referring now to FIG. 6C, the advance feature of the visualization software 32c increments 98 a pointer that retrieves lift chart data at the corresponding pointer and displays 100 a new lift chart with the retrieved data. Similarly, the rewind feature FIG. 6D decrements 102 a pointer and removes 104 corresponding lift chart data from the data set and then displays a new lift chart data without the data that was removed.

OTHER EMBODIMENTS

It is to be understood that while the invention has been described in conjunction with the detailed description thereof, the foregoing description is intended to illustrate and not limit the scope of the invention, which is defined by the scope of the appended claims. Other aspects, advantages, and modifications are within the scope of the following claims.

What is claimed is:

1. A computer program product residing on a computer readable medium for displaying results of modeling of expected behavior from execution of a plurality of modeling algorithms that model the expected behavior, comprises instructions for causing a computer to:

run the plurality of models on a set of test data to produce results of the expected behavior from the models and to produce data that can be converted into a measure of the expected behavior;

produce a visual representation, in the form of a lift chart or a receiver operating characteristic curve, of the results of modeling the expected behavior;

compare performance of the results of modeling the expected behavior to performance of a stored model;

render the results of modeling the expected behavior on an output device using different visual indicia to represent the different results of modeling the expected behavior.

2. The computer program product of claim 1 wherein the modeling algorithms are recency, frequency, monetary, Classification and Regression (CART), Chi squared Automatic Interaction Detection (CHAID) decision trees, linear regression algorithms, logistic regression algorithms, back propagation neural networks, leader/K-means clustering algorithms, step-wise search for input variable selection algorithms, genetic search for input variable selection, parametric tuning algorithms, cross-tabulation algorithms, and affinity matrices algorithms.

3. The computer program product of claim 1 wherein the visual representation displays results of running different variations of the same modeling algorithm.

4. The computer program product of claim 1 wherein the visual representation displays results of running different models of the same modeling algorithm.

5. A computer program product residing on a computer readable media for displaying results of modeling expected behavior comprises instructions for causing a computer to:

execute models of expected behavior based on different algorithm types;

generate a lift chart from results obtained from execution of a model;

compare performance of the model to performance of a stored best model of the same algorithm type;

if the performance of the executed model is better than the performance of the stored model, store lift data generated by the executed model; and update a display with a new lift chart having lift curves that are assigned unique visual indicia for a best model of each algorithm type.

6. A computer program product residing on a computer readable medium for displaying results of modeling expected behavior comprises instructions for causing a computer to:

execute models of expected behavior based on the same algorithm type;

generate a lift chart from results obtained from execution of the models;

compare performance of the models to performance of a stored model of the same algorithm type;

rank lift data generated by the models; and update the display based on the rank assigned to the lift data with a new lift chart having lift curves that are assigned unique visual indicia for the models of the same algorithm type.

* * * * *